United States Patent
Cabral, Jr. et al.

(10) Patent No.: US 7,667,278 B2
(45) Date of Patent: Feb. 23, 2010

(54) METAL CARBIDE GATE STRUCTURE AND METHOD OF FABRICATION

(75) Inventors: Cyril Cabral, Jr., Ossining, NY (US); Christophe Detavernier, Denderleeuw (BE); Rajarao Jammy, Hopewell Junction, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/372,140

(22) Filed: Mar. 10, 2006

(65) Prior Publication Data

US 2006/0186490 A1    Aug. 24, 2006

Related U.S. Application Data

(62) Division of application No. 10/722,557, filed on Nov. 28, 2003, now Pat. No. 7,064,050.

(51) Int. Cl.
| | |
|---|---|
| *H01L 29/76* | (2006.01) |
| *H01L 29/94* | (2006.01) |
| *H01L 31/062* | (2006.01) |
| *H01L 31/113* | (2006.01) |
| *H01L 31/119* | (2006.01) |
| *H01L 29/06* | (2006.01) |
| *H01L 29/12* | (2006.01) |

(52) U.S. Cl. ............................. 257/407; 257/10; 257/11
(58) Field of Classification Search ............. 257/10–11, 257/407, E27.62, E27.108
See application file for complete search history.

(56) References Cited

U.S. PATENT DOCUMENTS

| | | | | |
|---|---|---|---|---|
| 5,049,954 A | * | 9/1991 | Shimada et al. ............. | 257/280 |
| 5,294,822 A | * | 3/1994 | Verrett ........................ | 257/368 |
| 5,319,231 A | * | 6/1994 | Yamazaki et al. ........... | 257/344 |
| 5,342,806 A | * | 8/1994 | Asahina ...................... | 438/608 |
| 5,384,470 A | * | 1/1995 | Tachibana et al. ............ | 257/77 |
| 5,523,605 A | * | 6/1996 | Yamazaki et al. ........... | 257/369 |
| 5,770,490 A | * | 6/1998 | Frenette et al. ............. | 438/199 |
| 5,780,345 A | * | 7/1998 | Yamazaki et al. ........... | 438/282 |
| 5,882,965 A | * | 3/1999 | Schwalke et al. ........... | 438/227 |
| 5,965,911 A | | 10/1999 | Joo et al. | |
| 6,028,339 A | * | 2/2000 | Frenette et al. ............. | 257/364 |
| 6,194,748 B1 | * | 2/2001 | Yu .............................. | 257/216 |

(Continued)

FOREIGN PATENT DOCUMENTS

EP        0397576 A1    11/1990

OTHER PUBLICATIONS

Kwasnick et al., An Investigation of Molybdenum Gate for Submicrometer CMOS, IEEE Transaction on Electron Devices, vol. 35, No. 9, Sep. 1988, pp. 1432-1438.*

(Continued)

*Primary Examiner*—Ida M Soward
(74) *Attorney, Agent, or Firm*—Connolly Bove Lodge & Hutz LLP

(57) ABSTRACT

A semiconductor device such as a complementary metal oxide semiconductor (CMOS) including at least one FET that includes a gate electrode including a metal carbide and method of fabrication are provided. The CMOS comprises dual work function metal gate electrodes whereby the dual work functions are provided by a metal and a carbide of a metal.

13 Claims, 5 Drawing Sheets

U.S. PATENT DOCUMENTS

| | | | | |
|---|---|---|---|---|
| 6,344,663 | B1 * | 2/2002 | Slater, Jr. et al. | 257/77 |
| 6,492,688 | B1 * | 12/2002 | Ilg | 257/369 |
| 6,653,698 | B2 * | 11/2003 | Lee et al. | 257/407 |
| 6,794,234 | B2 * | 9/2004 | Polishchuk et al. | 438/199 |
| 6,835,638 | B1 * | 12/2004 | Forbes et al. | 438/590 |
| 6,858,524 | B2 * | 2/2005 | Haukka et al. | 438/585 |
| 6,869,889 | B1 | 3/2005 | Brask et al. | |
| 6,984,575 | B2 * | 1/2006 | Yamamoto | 438/585 |
| 7,122,414 | B2 * | 10/2006 | Huotari | 438/199 |
| 7,129,182 | B2 * | 10/2006 | Brask et al. | 438/745 |
| 7,148,546 | B2 * | 12/2006 | Visokay et al. | 257/369 |
| 2002/0014672 | A1 * | 2/2002 | Noble et al. | 257/413 |
| 2004/0113207 | A1 * | 6/2004 | Hsu et al. | 257/368 |
| 2005/0095763 | A1 * | 5/2005 | Samavedam et al. | 438/197 |
| 2005/0101134 | A1 | 5/2005 | Brask et al. | |
| 2005/0167755 | A1 | 8/2005 | Dubin et al. | |

OTHER PUBLICATIONS

James Pan et al., 2003, A Low-Temperature Metal-Doping Technique for Engineering the Gate Electrode of Replacement Metal Gate CMOS Transistors, IEEE Electron Device Letters, vol. 24, No. 9, Sep. 2003.

Quiang Lu et al, 2000, Dual-Metal Gate Technology for Deep-Submicron CMOS Transistors, 2000 Symposium on VLSI Technology Digest of Technical Papers, pp. 72-73.

Huicai Zhong, et al., Electrical Properties of $RuO_2$ Gate Electrodes for Dual Metal Gate Si-CMOS, IEEE Electron Device Letters, vol. 21, No. 12, Dec. 2000, pp. 593-595.

Yi Wei et al., 2001, Fabrication of Molybdenum Carbide and Hafnium Carbide Field Emitter Arrays, J. Vac. Sci. Technol. B 19(1), Jan/Feb 2001, pp. 42-46.

C. Spindt et al., Field-emitter Array Development for Field-Emission Displays, 2000, Proceedings of the SPIE - The International Society for Optical Engineering, vol. 3955, pp. 151-158.

* cited by examiner

METAL CARBIDE GATE STRUCTURE AND METHOD OF FABRICATION

This application is a divisional of U.S. application Ser. No. 10/722,557 filed Nov. 28, 2003.

TECHNICAL FIELD

The present invention relates to gate structures comprising metal carbides. This invention finds special applicability in complementary metal oxide semiconductor (CMOS) devices incorporating dual work function metal gate electrodes. More particularly, the present invention relates to dual work function metal gates wherein the dual work functions are provided by a metal and a carbide of a metal.

The present invention also relates to methods for fabricating the metal gate devices of the present invention.

BACKGROUND OF THE INVENTION

Advanced complementary metal oxide semiconductor (CMOS) devices are increasingly utilizing metal gate electrodes in order to avoid the "poly-Si depletion" and "boron penetration" effects observed with traditional gate electrodes of doped polycrystalline silicon (poly-Si). The selection of a particular metal for a gate material is guided by a number of considerations, including the work function and electrical resistivity desired for the gate, the thermal budget that the gate metal will be expected to survive, the type of gate dielectric (high-k or conventional), and the existence of a damage-free gate metal deposition process. Though mid-gap metals such as tungsten might be usable for both n-type field effect transistors (n-FETs) and p-type FETs (p-FETs) in CMOS, it is desirable to use one (high work function) gate metal appropriate for p-FETs and another (low work function) gate metal appropriate for n-FETs, in a design approach known as "dual metal/dual work function" CMOS.

Such dual metal/dual work function schemes can be very complex if the two different metals require different deposition and patterning processes. This is especially true when the patterning is done subtractively, since the second metal to be deposited must be removed without damaging the first. The complexity of such dual metal/dual work function schemes for CMOS metal gates has thus led to increased interest in "single metal/dual work function" schemes in which a single gate material is deposited over n-FET and p-FET device areas and then modified so that it has an n-FET-appropriate work function in n-FET device areas and a p-FET-appropriate work function in p-FET device areas.

Approaches to "single metal/dual work function" have been described in the literature. One approach [V. Misra et al., IEEE Electron Device Letters 23 354 (2002) and H. Zhong et al., IEDM Tech. Dig. 467 (2001)], suggests depositing a Ru—Ta alloy layer with an n-FET work function over n-FET and p-FET device areas and then converting the Ru—Ta alloy into a Ru-rich Ru—Ta alloy with a p-FET work function (in the p-FET device areas) by depositing additional Ru and annealing.

In another approach, a metal such as Mo with a p-FET work function is deposited over n-FET and p-FET device areas and converted into a Mo nitride having a n-FET work function (in n-FET device regions) by either ion implantation of nitrogen [P. Ranade et al., Mat. Res. Soc. Proc. 670 K5.2 (2001); R. Lin et al., IEEE Electron Device Letters 23 49 (2002)] or solid state diffusion/reaction of nitrogen from an N-rich overlayer of TiN [R. J. P. Lander et al., Mat. Res. Soc. Symp. Proc. 716 B5.11 (2002)].

A drawback of the nitrogen ion implantation approach is that it can damage the underlying gate dielectric [T. Amada et al., Mat. Res. Soc. Symp. Proc. 716 B7.5 (2002)]. Solid state diffusion of nitrogen from TiN results in less damage, but does not quite provide sufficient change in the work function (~−0.5 eV observed for Mo on $SiO_2$, ~−0.75 eV is desired). Drawbacks of the Ru—Ta alloy approach include the potential for tantalum reaction with the gate dielectric, and the lack of chemical vapor deposition (CVD) methods for the Ru—Ta alloy (since CVD is one of the few deposition processes that is free from dielectric-damaging charged particle bombardment).

SUMMARY OF INVENTION

The present invention relates to providing alternative methods for forming single metal/dual work function gate electrodes for CMOS. The present invention addresses problems described above.

The present invention relates to a semiconductor device containing source drain/regions and gate regions wherein at least one gate electrode comprises a metal carbide obtained by reacting a metal and a carbon-containing layer.

A further aspect of the present invention relates to a dual work function complementary metal oxide semiconductor (CMOS) circuit which comprises at least one FET having a gate electrode formed from a conductive material, and at least one FET having a gate electrode comprising a metal carbide obtained by reacting a metal and a carbon-containing layer, wherein the metal differs from the conductive material.

This invention additionally relates to a dual work function complementary metal oxide semiconductor (CMOS) circuit which comprises at least one FET having a gate electrode formed from a first metal, and at least one FET having a gate electrode formed from a carbide of said first metal.

Another aspect of the present invention relates to a method of forming a gate for a FET which comprises providing a substrate, and depositing on said substrate a metal and a carbon-containing layer and reacting said metal and carbon-containing layer to form a metal carbide for providing a gate electrode.

A still further aspect of the present invention is concerned with a method of forming a dual work function CMOS device on a substrate. The method comprises:

depositing a metal layer on a first and second set of gate regions;

providing a carbon-containing layer in contact with one of said first and second set of gate regions and not on the other of said first and second set of gate regions, said carbon-containing layer being in direct contact with said metal layer on said one of said first and second set of gate regions;

reacting said carbon-containing layer on said one of said first and second set of gate regions with said metal on said one of said first and second set of gate regions to form a metal carbide.

Other objectives and advantages of the present invention will become readily apparent to those skilled in this art from the following detailed description, wherein it is shown and described only the preferred embodiments of the invention simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not as restrictive.

DESCRIPTION OF BEST AND VARIOUS EMBODIMENTS

Figure 1A:
FIGS. 1A-1E show, in cross-section view, the basic steps of a method of the present invention for fabricating CMOS gate electrodes.

The present invention relates to semiconductor structures comprising at least one FET having a gate electrode. In order to facilitate an understanding of the present invention, the detailed description relates to the preferred aspect of "single metal dual work function" metal gates.

According to preferred aspects, the present invention provides a new approach to "single metal/dual work function" metal gates wherein the dual work functions are provided by a metal and a carbide of the metal.

Accordingly, one aspect of the present invention relates to a dual work function complementary metal oxide semiconductor (CMOS) circuit which comprises at least one FET having a gate electrode formed from a first metal, and at least one FET having a gate electrode formed from a carbide of said first metal.

The present invention also provides a dual work function CMOS circuit which comprises at least one FET having a gate electrode formed from a first metal and at least one additional element and at least one FET having a gate electrode formed from a carbide of said first metal.

The dual work function CMOS structures according to the present invention can be fabricated by depositing a metal with a first work function over both n-FET and p-FET device areas, and then reacting with a carbon-containing layer in selected areas to form a metal carbide with a second work function different from the first work function. For the purposes of the present invention, the term "carbide" is defined as a compound or mixture of carbon with one or more elements more electropositive than carbon.

One process technique for fabricating the dual work function CMOS structures on a substrate according to the present invention comprises:

depositing a metal layer with a first work function;

patterning the metal layer to form a first and second set of gate-shaped structures;

forming a patterned a layer of carbon-containing material so that the carbon-containing material is disposed on one of the first and second set of gate-on the substrate shaped structures and absent from other of the first and second set of gate shaped structures reacting the patterned carbon-containing material with the metal in regions where both are present to form a material with a second work function;

optionally removing carbon residuals remaining after the reaction; and optionally annealing in an inert or reactive ambient to repair any processing damage.

Examples of providing the patterned carbon-containing layer include depositing a carbon-containing layer and patterning said carbon-containing layer by selectively removing it from one of said first and second set of gate regions by a process such as reactive ion etching while leaving it remaining on the other of said first and second set of gate regions; and depositing and patterning a photoresist layer, blanket-depositing a carbon-containing layer on said photoresist layer and then removing said photoresist along with the carbon-containing layer located on top of the photoresist while leaving the carbon-containing layer not located on top of the photoresist.

Reference to FIGS. 1A-1E illustrates the above sequence for fabricating dual work function CMOS structures according to the present invention.

Figure 1B:
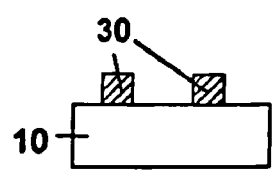
Figure 1C:
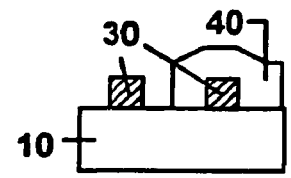
Figure 1D:
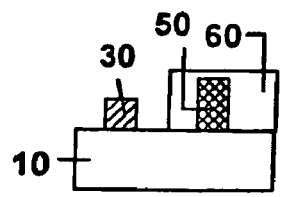
Figure 1E:
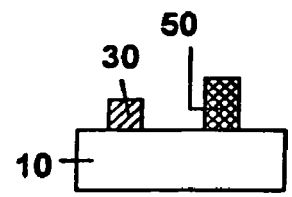
Figure 2A:
FIGS. 2A-2D show a first variation of the method of FIG. 1.
Figure 2B:
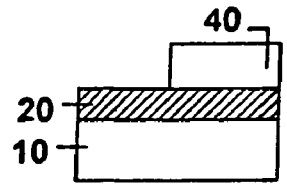
Figure 2C:
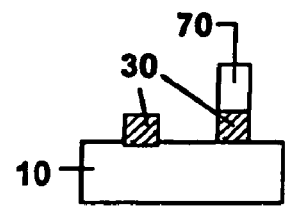
Figure 2D:
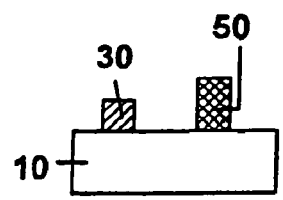

FIG. 1A shows substrate 10 after deposition of metal layer 20 having a first work function. Substrate 10 typically begins as one or more semiconductor layers under an insulating gate dielectric and eventually comprises dielectric isolation regions, heavily doped semiconductor source/drain regions, and lightly doped or undoped semiconductor channel regions. FIG. 1B shows the structure of FIG. 1A after metal layer 20 has been patterned to form metal gate structures 30. FIG. 1C shows the structure after formation of a patterned of carbon-containing layer 40. The structure of FIG. 1C is annealed to produce metal carbide gate structure 50 having a second work function, and leftover carbon-containing layer 60. Leftover carbon-containing layer 60 may then be removed by a process such as an oxygen plasma treatment to produce the structure of FIG. 1E with metal gate 30 with a first work function and metal carbide gate 50 with a second work function.

In the process flow shown in FIG. 1A-1E, metal layer 20 is deposited and patterned to form metal gate structures before deposition of patterned carbon-containing layer 40. However, the steps of the process may be implemented in a variety of permutations. For example, gate patterning may be done before or after carbon deposition; carbon deposition may be done before or after metal deposition; and carbide formation may be done before or after gate patterning.

FIGS. 2 and 3 show two examples of process flows in which gate electrode patterning is done after the metal and patterned carbon-containing layers are deposited. In the process flow of FIGS. 2A-2D, carbide formation takes place after gate patterning. FIG. 2A shows substrate 10 after deposition of metal layer 20 having a first work function. FIG. 2B shows the structure of FIG. 2A after deposition of patterned carbon-containing layer 40. FIG. 2C shows the structure after gate patterning to form metal gates 30 and gate-shaped carbon-containing layer 70. The structure of FIG. 2C is then annealed to produce the structure of FIG. 2D with metal gate 30 with a first work function and metal carbide gate 50 with a second work function. Remnants of gate-shaped carbon-containing layer 70 remaining after the anneal may be removed by a process such as an oxygen plasma treatment.

Figure 3A:
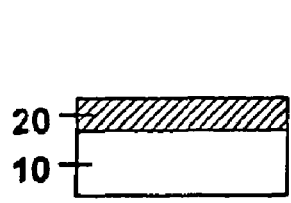
FIGS. 3A-3D show a second variation of the method of FIG. 1.

In the process flow of FIGS. 3A-3D, carbide formation takes place before patterning. FIG. 3A shows substrate 10 after deposition of metal layer 20 having a first work function.

Figure 3B:
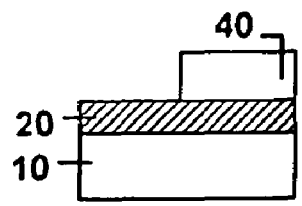
Figure 3C:
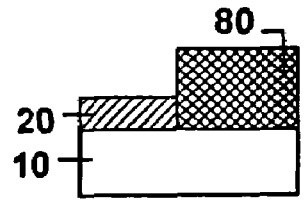
Figure 3D:
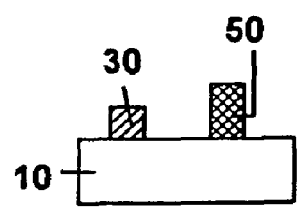

FIG. 3B shows the structure of FIG. 3A after deposition of patterned carbon-containing layer 40. The structure of FIG. 3B is then annealed to produce the structure of FIG. 3C with metal carbide layer 80. Metal layer 20 and metal carbide layer 80 are then patterned to form metal gate 30 with a first work function and metal carbide gate 50 with a second work function. Remnants of gate-shaped carbon-containing layer 40 remaining after the anneal may be removed by a process such as an oxygen plasma treatment.

Figure 4A:
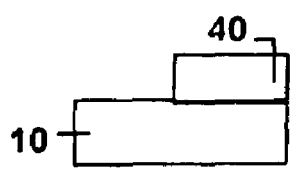
FIGS. 4A-4D show a third variation of the method of FIG. 1.
Figure 4B:
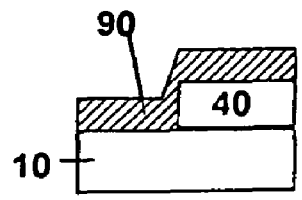
Figure 4C:
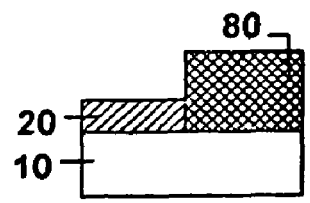
Figure 4D:
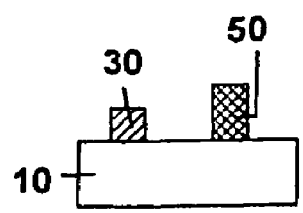

The process can also be implemented with the carbon-containing layer deposited before the metal layer. This is shown in FIG. 4 for a process flow in which the carbide formation anneal is performed before gate patterning, in a process flow analogous to that of FIG. 3. FIG. 4A shows substrate 10 after deposition of patterned carbon-containing layer 40. FIG. 4B shows the structure after deposition of metal layer 90 having a first work function. The structure of 4B is then annealed to produce the structure of FIG. 4C with metal carbide layer 80. Metal layer 90 and metal carbide layer 80 are then patterned to form metal gate 30 with a first work function and metal carbide gate 50 with a second work function. Remnants of metal layer 90 remaining above metal carbide layer 80 would typically be left in place, since the additional metal would not be expected to affect the work function at the metal carbide/substrate interface.

Figure 5A:
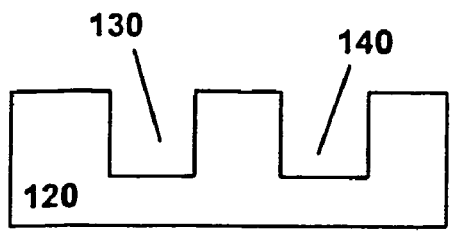
FIGS. 5A-5H show a variation of the method of FIG. 1 adapted for a replacement gate process flow.
Figure 5B:
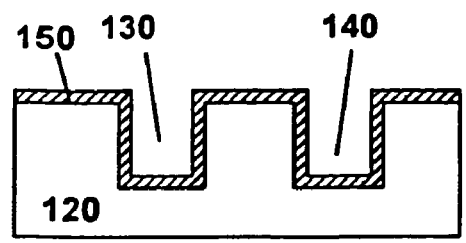
Figure 5C:
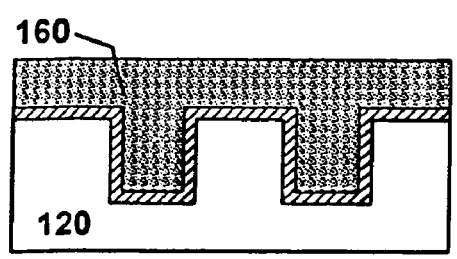
Figure 5D:
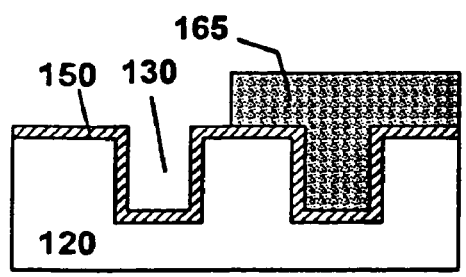
Figure 5E:
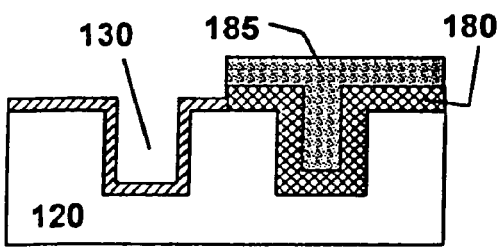
Figure 5F:
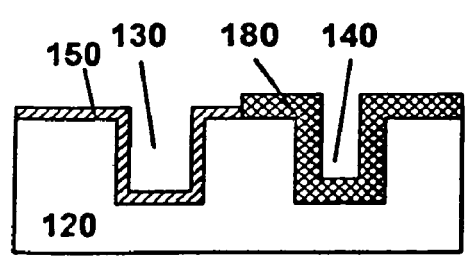
Figure 5G:
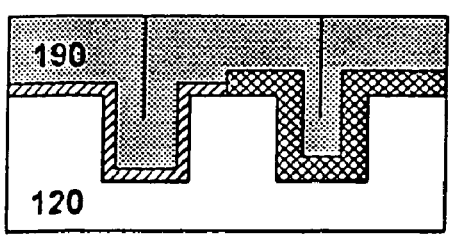
Figure 5H:
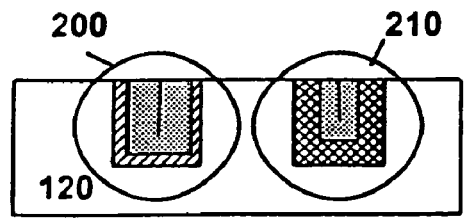

FIGS. 5A-5H show how the invention could be implemented for the case of a replacement gate process flow [see, for example, B. Guillaumot et al., IEDM Tech. Digest, p. 355 (2002)]. FIG. 5A shows substrate 120 with a first gate cavity region 130 and second gate cavity region 140; FIG. 5B shows the structure of FIG. 5A after deposition of a blanket-deposited metal layer 150 having a first work function, and FIG. 5C shows the structure of after blanket deposition of carbon-containing layer 160. FIG. 5D shows the structure of FIG. 5C after carbon-containing layer 160 has been patterned to form patterned carbon-containing layer 165 which is disposed on gate cavity region 140 and absent from gate cavity region 130. The structure of FIG. 5D is then annealed to produce metal carbide 180 and leftover carbon-containing layer 185 (FIG. 5E) in gate cavity region 140. Leftover carbon-containing layer 185 is then removed by an oxygen plasma treatment to produce the structure of FIG. 5F with metal gate 150 having a first work function and metal carbide gate 180 having a second work function. The structure of FIG. 5F would ordinarily be completed by filling gate cavity regions 130 and 140 with a conductive material 190 (FIG. 5G), and then planarizing to form completed metal first gate 200 and completed metal carbide second gate 210 (FIG. 5H).

In cases where the metal and the metal's carbide do not provide sufficiently different work functions, it may be desirable to extend the methods of this invention to modify the work function of the metal that is not carbided. Modifications to the metal that is not carbided may be performed (i) before or after carbide formation, and (ii) before or after gate patterning. The modifications may be effected by processes such as alloying, mixing, or reaction with at least one additional element, implantation with one or more species of ions, etc. For example, single metal dual work function CMOS gates may be fabricated from a mid-gap metal by carbiding the mid-gap metal to form a first set of gates with a first work function, and alloying or implanting the non-carbided mid-gap metal with one or more elements to form a second set of gates with a second work function.

Metals that may be considered for the metal/metal carbide processes of the present invention include any conductive materials, for example, Al, Ba, Be, Bi, Co, Cr, Cu, Dy, Fe, Ga, Gd, Ir, Hf, Mg, Mo, Mn, Nb, Ni, Pd, Pt, Ir, La, Os, Pr, Nb, Rh, Re, Ru, Sc, Sn, Ta, Ti, V, W, Y, Zn, and Zr; conductive nitrides, silicides, germanides, and silicon nitrides of these metals or their alloys; conductive alloys or compounds of these metals with or without additional nonmetallic elements.

Deposition techniques for these metals may include thermal evaporation, electron-beam evaporation, sputtering, reactive sputtering, ion beam sputtering, electroless deposition, CVD, metal-organic CVD (MOCVD), plasma-enhanced CVD (PECVD), and atomic layer deposition (ALD).

Preferred metals for this process include Mo, Mo—Ru alloys, and other p-FET (high work function) metals that form carbides. Preferred metal deposition techniques for this process include CVD and MOCVD because there is no energetic charged particle bombardment tending to damage the gate dielectric.

The carbon-containing layers of this process may include any carbon-containing material deposited by any method. The carbon-containing layers may comprise, for example, diamond, graphite; amorphous carbon with minimal H content; amorphous hydrogenated carbon (a-C:H, also known as diamond-like-carbon or DLC); carbon-containing polymers such as poly(methyl)methacrylate, polyimide, SiLK; organic photoresists; amorphous carbon-containing layers containing other elements such as Si, O, N, and/or H (e.g., SiCOH or SiCH).

Deposition methods for these carbon-containing layers may include spin-on techniques, solution-casting techniques, CVD, plasma-assisted CVD (PACVD), plasma-enhanced CVD (PECVD), thermal evaporation, electron-beam evaporation, sputter deposition from a carbon-containing target using an inert or reactive working gas, ion beam sputtering. It should be noted that certain carbon-containing layers may require stabilization anneals if they are deposited before the metal. For example, a carbon-containing layer of DLC is typically given a stabilization anneal (e.g., 400° C. for 4 hrs in He) prior to metal deposition to prevent blistering during carbide formation.

Preferred carbon-containing layers include pure carbon deposited by physical sputtering and amorphous hydrogenated carbon (also known as diamond-like carbon or DLC) deposited by PECVD.

The carbon layer is easily patterned (by oxygen-based reactive ion etching, for example) so that it remains only over n-FET device areas. When metal carbide formation is complete, the excess carbon remaining may be selectively removed by an oxygen-based ashing or reactive ion etching plasma. The metal Mo and its carbides are both quite resistant to oxidation.

If desired, the electrode stacks may be annealed in an inert or reactive ambients to repair any process damage and/or to improve the device characteristics. This annealing may be performed at any stage of the process.

The metal layers of this invention typically have a thickness of about 2 to about 500 nanometers, more typically about 5 to about 50 nanometers. The optimum thickness for the carbon-containing layers of this invention will depend on several factors: the stoichiometry of the desired carbide (e.g., MC, $M_2C$, $M_3C$, where M denotes the metallic element being carbided), the thickness of the metal layer, the carbon content of the carbon-containing layer (e.g., sputtered deposited C has a higher carbon content than a-C:H), and the order of the layers (a slight excess of carbon might be desirable if the metal is under the carbon, whereas a slight excess of metal might be desirable if the carbon is under the metal). The areal density of metal atoms (atoms/cm$^2$) in a metal layer may be computed from the metal's thickness, density, and molecular weight (MW). A Mo layer 30 nanometers in thickness would be expected to have an areal density of 1.9e17 Mo atoms/cm$^2$ (based on a MW of 96 g/mole and a density of 10.2 g/cm$^3$). The thickness of an amorphous carbon layer needed to provide exactly half this number of C atoms (to make Mo$_2$C) would be 9.5 nanometers (given a MW of 12 g/mole and a density of 2 g/cm$^3$).

The annealing temperature/time conditions typical for carbide formation depend on the identity of the metal and the stoichiometry of the desired carbide. Annealing for higher temperatures or longer times than needed to form a desired first carbide (such as M$_2$C) might lead to further reaction and formation of an undesired second carbide with a higher carbon content (such as MoC). The optimum annealing will also depend, to a lesser extent, on the metal film thickness and the type of carbon (e.g., sputtered deposited C vs. a-C:H). Carbide formation in carbide-forming metals will typically occur at temperatures of about 400 to about 1100° C. Interestingly, carbide formation at the lower end of this temperature range may be facilitated by incorporation of hydrogen [A. Rubinshtein et al., "Surface treatment of tantalum to improve its corrosion resistance, "Mater. Sci. Eng. A A302, 128 (2001)]. Annealing ambients are typically be selected from the following gases and their mixtures: Ar, He, H$_2$, N$_2$, CHx. N$_2$, and forming gas. N$_2$ would be a less preferred ambient for metals readily forming nitrides. The annealing time required for completion of the carbide reaction will depend on the temperature; for a given metal and metal thickness, the required annealing time will decrease as the annealing temperature increases.

Carbide forming metals include Cr, Fe, Hf, Mn, Mo, Nb, Ni, Ta, Ti, V, W, and others. Of these, Fe is among the metals forming carbides at the low end of the 400-1000° C. temperature range and W is among the metals forming carbides at the high end of this temperature range. Typically a rapid thermal anneal at about 750° C. for about 1 min in N$_2$ is sufficient to completely convert a bilayer film of C on Mo (30 nanometers) to Mo$_2$C.

Figure 6A:
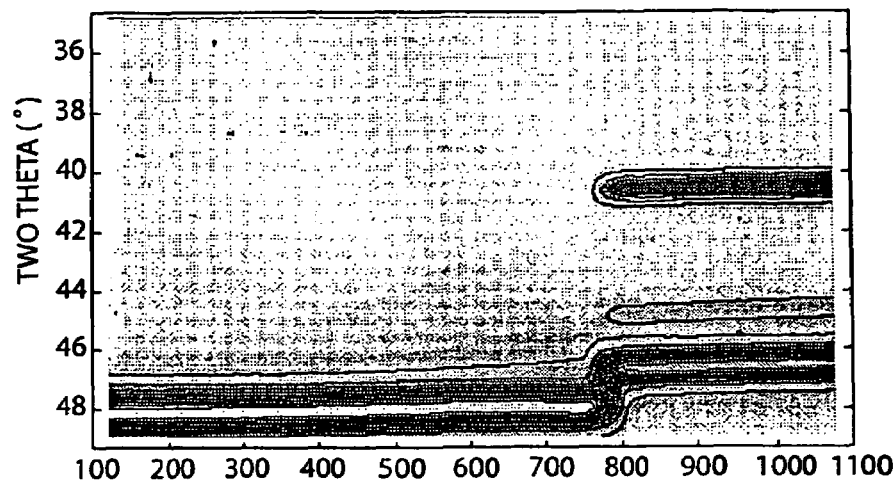
FIGS. 6A-6C compare Mo carbide formation for sample geometries corresponding to three embodiments of the invention.
Figure 6B:
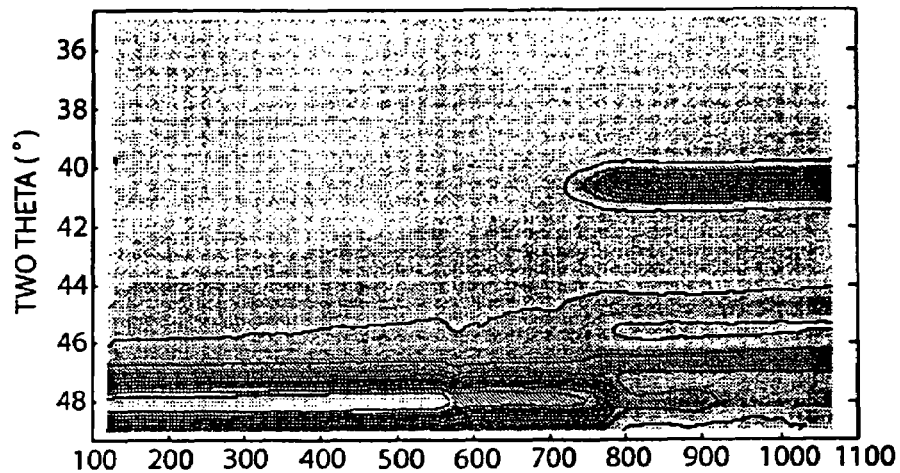
Figure 6C:
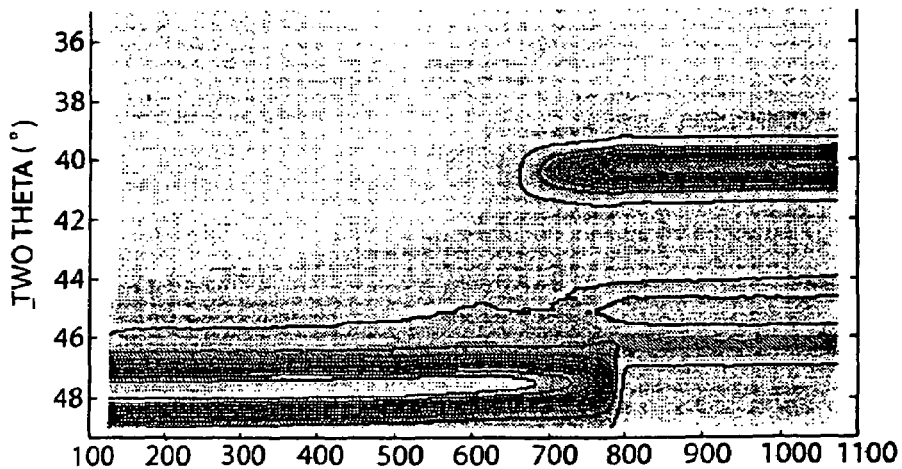

FIGS. 6A-6C examine Mo carbide formation for sample geometries corresponding to three embodiments of the invention: a blanket Mo layer over a layer of sputtered carbon, a blanket Mo layer over a layer of DLC (annealed for 4 hours at 400° C. in He prior to metal deposition), and a blanket Mo layer under a layer of sputtered carbon. The Mo in all samples is 30 nanometers thick and deposited by sputtering. Carbide formation is monitored during rapid thermal annealing (at 3° C./sec in a He ambient) by in situ x-ray diffraction (XRD) with synchrotron radiation having a wavelength of 0.1797 nanometers, intensity of 10$^{13}$ photons/s and energy resolution of 1.5% [G. B. Stephenson et al., Rev. Sci. Instrum. 60 1537 (1989)].

All samples initially show a single XRD peak at 2θ=48o, corresponding to the Mo 110 reflection. Carbide formation is indicated by the disappearance of the Mo 110 peak and the appearance of hexagonal Mo$_2$C peaks at 47o (MO$_2$C 101), 45o (Mo$_2$C 002) and 40.5o (MO$_2$C 100). The plot of FIG. 6A, for a sputtered Mo layer on top of a 200 nanometers-thick sputtered C layer, shows a sharply defined reaction around 775° C. The plot of FIG. 6B, for a nominally identical sputtered Mo layer on top of a 180 nanometers-thick layer of DLC, shows a slightly broader reaction that is also centered around 775° C. The plot of FIG. 6C, for a sputtered Mo layer under a 30 nanometers-thick layer of sputtered C, shows an even broader reaction centered around a slightly lower temperature (~760° C.). The thermal treatments needed for carbide formation in these cases is thus well within typical thermal budgets for CMOS.

Figure 7:
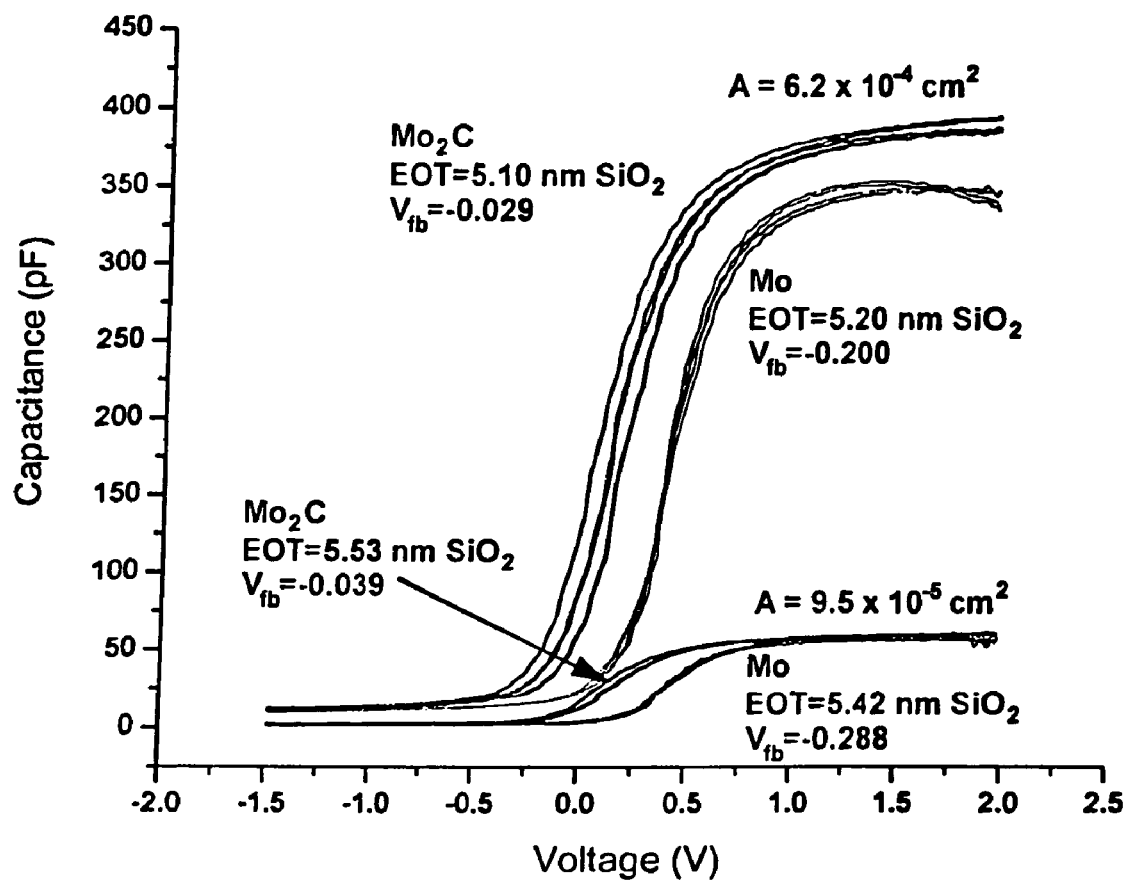
FIG. 7 shows capacitance-voltage (C-V) measurements used to determine the work functions of mo and $Mo_2C$ capacitor electrodes.

The electrical measurements of FIG. 7 verify that the work function of Mo is substantially lowered upon carbide formation. Capacitance-voltage (C-V) measurements were performed on Si(substrate)/SiO$_2$(5 or 11 nanometers)/Mo(C) capacitors with Mo and Mo carbide electrodes. Mo(30 nanometers) and Mo(30 nanometers, bottom)/C(10 nanometers, top) electrode films are sputter deposited through a Si membrane mask with electrode area openings of 6.2e-04 cm or 9.5e-05 cm onto oxide-coated n-type single crystal (100) Si. Both Mo and Mo/C electrodes receive "carbide formation" anneals (3° C./sec ramp to 900° C. in forming gas) sufficient to convert the Mo/C electrode to Mo$_2$C. FIG. 7 shows data for the case of 5 nanometers SiO$_2$. Analysis of the C-V slopes and voltage intercepts indicate a work function of 4.50-4.60 eV for Mo and one of 4.25-4.35 eV for Mo$_2$C.

Moreover, as mentioned above, the metal carbides such as those formed by the solid state reaction of a first metal with a carbon-containing layer may also be used as gate electrodes in single FETs, in pluralities of FETs, and in dual work function CMOS circuits where at least one other gate electrode is formed from a conductive material different from the metal carbide and different from the metal from which the carbide was formed.

It should be noted that forming a metal carbide gate by the solid state reaction of a first metal with a carbon-containing layer has a number of advantages over processes in which the metal carbide layer is formed in one step. Sputter deposition processes can deposit high quality metal carbides, but are likely to damage the exposed gate dielectric (due to the energetic charged particle bombardment). CVD processes are damage-free, but cannot easily co-deposit a metal with carbon without incorporating substantial amounts of impurities such as oxygen. With the present bi-layer reaction process, a bottom metal layer may be cleanly deposited by CVD, with subsequent deposition of a carbon-containing layer by any preferred method (including sputtering, since the presence of the previously deposited metal layer protects the gate dielectric).

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the invention concept as expressed herein, commensurate with the above teachings and/or skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed as new and desired to be protected by Letters Patent of the United States is:

1. A dual work function CMOS device which comprises:
   at least one FET having a gate formed from a first gate metal consisting of Mo or a Mo- Ru alloy; and
   at least one FET having a gate formed from a carbide of said first gate metal,
   wherein the first gate metal is Mo and the carbide formed from the first gate metal is Mo$_2$C.

2. The dual work function CMOS device according to claim 1, wherein each FET is a p-FET or an n-FET.

3. The dual work function CMOS device according to claim 1, wherein each gate metal has a thickness ranging from about 2 to about 500 nm.

4. The dual work function CMOS device according to claim 1, wherein each gate metal has a thickness ranging from about 5 to about 50 nm.

5. The dual work function CMOS device according to claim 1, wherein the first gate metal has a thickness of 30 nm.

6. The dual work function CMOS device according to claim 1, wherein the CMOS device has a dual metal/dual work function.

7. The dual work function CMOS device according to claim 1, wherein the first gate metal has a first work function and the second gate metal has a second work function.

8. A dual work function CMOS device which comprises: a substrate;
   at least one FET having a gate formed from a first gate metal consisting of Mo or a Mo- Ru alloy on the substrate; and
   at least one FET having a gate formed from a carbide of said first gate metal on the substrate,
   wherein the first gate metal is Mo and the carbide formed from the first gate metal is $Mo_2C$, and
   wherein the CMOS device has a dual metal/dual work function.

9. The dual work function CMOS device according to claim 8, wherein the first gate metal has a first work function and the second gate metal has a second work function.

10. The dual work function CMOS device according to claim 8, wherein each FET is a p-FET or an n-FET.

11. The dual work function CMOS device according to claim 8, wherein each gate metal has a thickness ranging from about 2 to about 500 nm.

12. The dual work function CMOS device according to claim 8, wherein each gate metal has a thickness ranging from about 5 to about 50 nm.

13. The dual work function CMOS device according to claim 8, wherein the first gate metal has a thickness of 30 nm.

* * * * *